United States Patent
Mueller

[11] Patent Number: 6,055,049
[45] Date of Patent: Apr. 25, 2000

[54] METHOD AND APPARATUS FOR CALIBRATING A TRAVEL PATH AND/OR AN ANGULAR POSITION OF A HOLDING DEVICE IN A MEANS FOR MANUFACTURING ELECTRICAL ASSEMBLIES AS WELL AS A CALIBRATION SUBSTRATE

[75] Inventor: Werner Mueller, Unterhaching, Germany

[73] Assignee: Siemens Aktiengesellschaft, Munich, Germany

[21] Appl. No.: 09/179,830

[22] Filed: Oct. 28, 1998

[30] Foreign Application Priority Data

Sep. 2, 1998 [DE] Germany ............ 198 39 999

[51] Int. Cl.$^7$ ....................... G01J 1/10
[52] U.S. Cl. ....................... 356/243.1
[58] Field of Search ............ 356/243.1–243.8, 356/375, 376, 399–401, 237.1–237.6

[56] References Cited

U.S. PATENT DOCUMENTS 4,055,376 10/1977 Daberko .
5,537,204 7/1996 Woodhouse .

FOREIGN PATENT DOCUMENTS

| 38 78 297 T2 | 8/1993 | Germany . |
|---|---|---|
| 42 27 667 A1 | 2/1994 | Germany . |
| 42 34 856 A1 | 6/1994 | Germany . |
| 197 11 476 A1 | 10/1998 | Germany . |

*Primary Examiner*—K. P. Hantis
*Attorney, Agent, or Firm*—Hill & Simpson

[57] ABSTRACT

Prior art methods calibrate the travel path and/or the angular position of holding devices in equipment for manufacturing electrical assemblies by optical measurements of the position of simulations of electrical components that are equipped on a calibration substrate. Markings on the simulations and local reference marks on the calibration substrate serve this purpose. Printed circuit board cameras that are utilized as optical sensors exhibit a pronounced camera distortion that makes the calibration more difficult. As a result of the method, the apparatus as well as the calibration substrate, a sensor correction factor is determined in that the position of two correction marks that are applied on the calibration substrate at a predetermined nominal spacing and a predetermined position relative to one another are measured with the printed circuit board camera. The result of the measurement is compared to the nominal spacing.

8 Claims, 2 Drawing Sheets

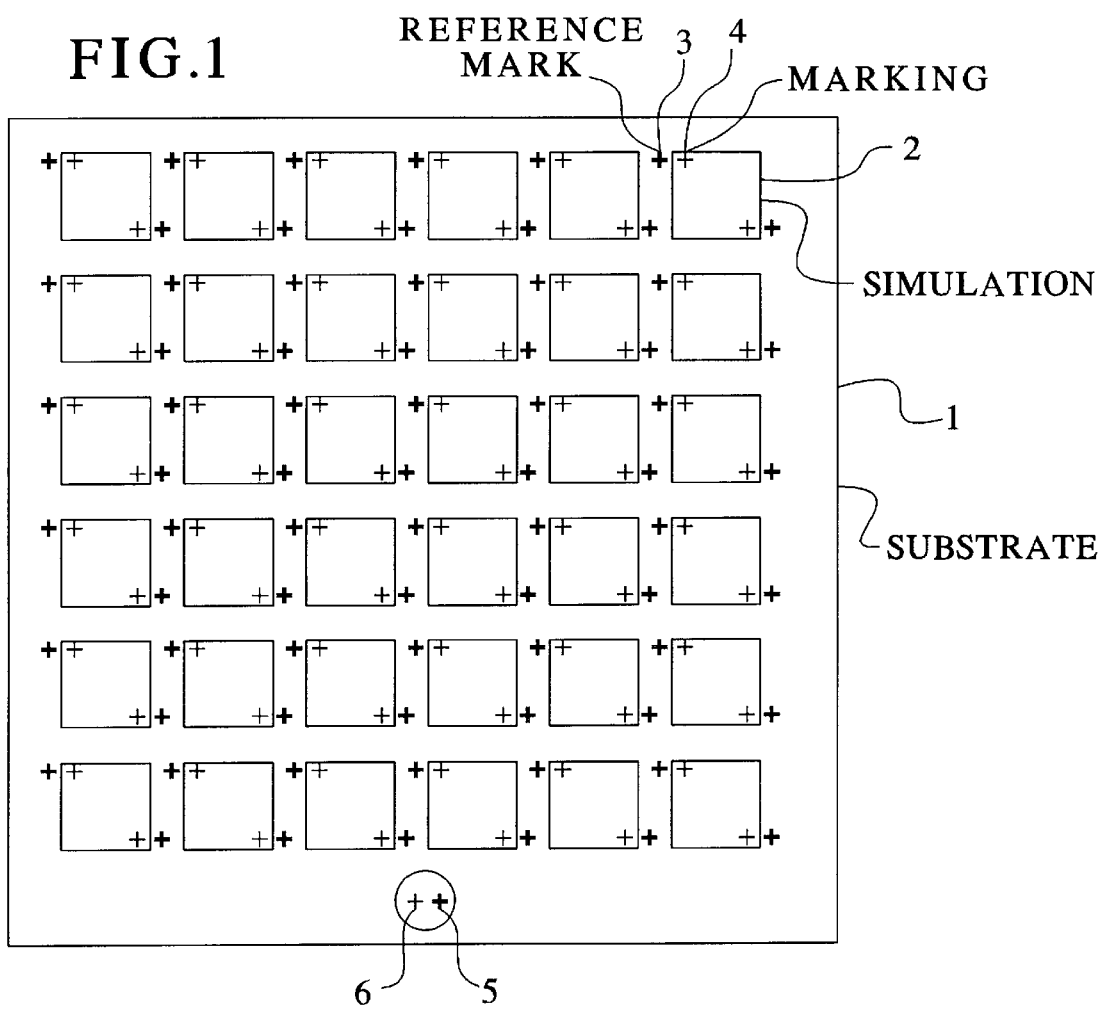
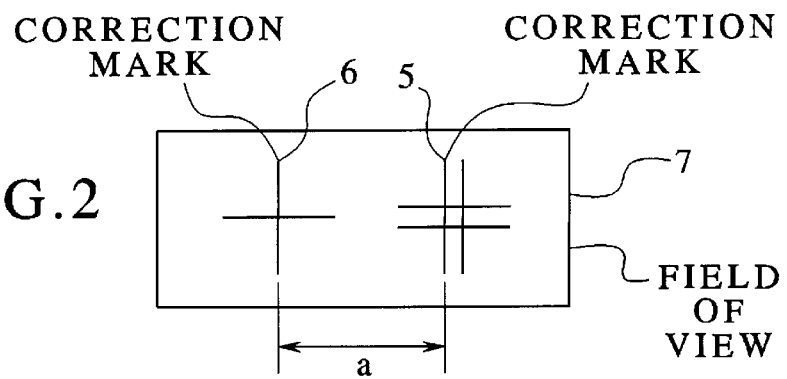

METHOD AND APPARATUS FOR CALIBRATING A TRAVEL PATH AND/OR AN ANGULAR POSITION OF A HOLDING DEVICE IN A MEANS FOR MANUFACTURING ELECTRICAL ASSEMBLIES AS WELL AS A CALIBRATION SUBSTRATE

BACKGROUND OF THE INVENTION

The present invention is directed to a method, an apparatus and a calibration substrate for calibrating a travel path and/or an angular position of a holding device in a means for manufacturing electrical assemblies, particularly for equipping printed circuit boards with components.

For calibration of a travel path and/or of an angular position of a holding device in a means for manufacturing electrical assemblies, for example, a calibration substrate of a printed circuit board was previously equipped with simulations of the components at defined placement locations. The simulations are conveyed at the holding device to a calibration substrate from a magazine, analogous to the transport of components from delivery units up to the placement location on a printed circuit board. It is standard to employ a glass plate similar to a printed circuit board as the calibration substrate, and has centering marks in its corner regions. The glass plate is provided with a double-sided adhesive film or with a spray glue and is placed into a means, for example an automatic equipping unit, whereupon the position of the centering marks is identified with a topically resolving printed circuit board camera of the automatic equipping unit. Subsequently, the calibration substrate is equipped with simulations of components at locations defined relative to the centering marks.

The equipped glass plate can then be measured in various ways. In a first known method, the equipped glass plate is placed into an optical measuring instrument. The glass laminae exhibit the fine markings whose position relative to the centering marks of the glass plate is determined in the measuring instrument. Correction values are determined from the positional deviations from the desired ideal position in the coordinate directions and with respect to the rotated amplitude. These are input as correction parameters into the automatic equipping machine that takes these deviations into consideration during the later equipping of printed circuit boards with components.

A further prior art method is disclosed in German Patent Application 197 11 476.8. Here, the equipped glass plate is measured in the automatic equipping unit by the printed circuit board camera. The printed circuit board camera thereby registers local reference marks in its field of view that are present on the glass plate, together with defined markings of the glass laminae. The corresponding correction values are determined from their relative positions, these correction values being subsequently taken into consideration when equipping printed circuit boards with components.

The printed circuit board camera, however, exhibits an individual-dependent camera distortion that is especially pronounced given lenses with a short focal length. Due to this situation, errors in the range of ±15 μm arise when measuring automatic equipping units and what is thereby the multiple use of this optical sensor unit.

SUMMARY OF THE INVENTION

The object of the present invention is to provide an improved method and apparatus with which the travel path and/or the angular position of a holding means in an apparatus for manufacturing electrical assemblies can be calibrated, whereby an optical sensor means present in the apparatus is used.

In general terms the present invention is a method for the calibration of a travel path and/or of an angular position of a holding device in a means for manufacturing electrical assemblies, particularly for equipping printed circuit boards with components. The calibration substrate in the manner of a printed circuit board is equipped by the means with of the components at defined placement locations. The position of the simulations relative to local reference marks of the calibration substrate is determined on the basis of positionally defined, optical structure features of the simulations by a topically resolving optical sensor. The optical sensor measures the spacing between first and second correction marks that are applied on the calibration substrate in a predetermined nominal spacing. A sensor correction factor is determined by comparing the measured spacing to the nominal spacing. This sensor correction factor is taken into consideration in the positional determination of the simulations for the compensation of an optical distortion. The present invention is also an apparatus for the implementation of a method for the calibration of a travel path and/or of an angular position of a holding device according to the above described method. Using the means, a calibration substrate in the manner of a printed circuit board can be equipped with simulations of the components at defined placement locations. The position of the simulations relative to local reference marks of the calibration substrate can be determined on the basis of positionally defined structure features of the simulations by an optical sensor. At least one correction parameter for a control device of the means for manufacturing the assemblies can be calculated from the determined deviations of the position of the structure features from their predetermined ideal position. First and second correction marks are applied to the calibration substrate such that their predetermined nominal spacing at least approximately corresponds to the spacing between the local reference marks and the structure features and their position relative to one another corresponds to the relative position of the local reference marks to the structure features.

In the inventive method, with the inventive apparatus as well as with the inventive calibration substrate, the distance between first and second correction marks is advantageously initially measured by the optical sensor. These correction marks are applied on the calibration substrate (the glass plate) in a predetermined nominal spacing. By comparing the identified spacing with the nominal spacing, a sensor correction factor is determined that is taken into consideration in the position identification of the individual simulation on the calibration substrate. As a result of this method, the optical sensor is exactly calibrated in a limited region of its field of view (partial mapping).

In the advantageous development the spacing of the local reference marks from the optical structure features is selected approximately equal to the nominal spacing. The position of the marking relative to the local reference marks corresponds to the relative position of the second to the first correction mark. The respective markings exhibit the same attitude (position and spacing) relative to one another, is assured that the optical sensor is used only in the region for which it is also exactly measured.

The shape of the local reference marks and for the markings corresponds to the shape of the first and second correction mark. This works exactly when the respective markings also exhibit an identical or, respectively, similar shape.

A nominal spacing is selected smaller than the field of view of the optical sensor. The first and second correction marks are simultaneously registered by the optical sensor. This takes an especially simple and fast form when the nominal spacing is selected smaller than the field of view of the optical sensor, so that the first and the second correction mark as well as the local reference marks and markings are simultaneously registered by the optical sensor.

A further improvement of the precision is achieved in that, the local reference marks are registered at least approximately at the same location of the field of view of the optical sensor as the first correction mark. It is thereby assured that the same, already calibrated region of the optical sensor is always employed for the measuring.

In an advantageous apparatus of the implementation of the method an imaginary connecting line between the local reference marks and the structure features proceeds at least approximately perpendicular to edges of the simulations. The imaginary connecting line between the local reference marks and the structure features proceeds perpendicular to edges of the simulations, as a result whereof the measuring is not made more difficult by additional reflections at further edged of the simulations.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 1 is a plan view onto a calibration substrate with simulations of components placed thereon; and FIG. 2 is a magnified portion from the calibration substrate of FIG. 1 with the first and the second correction mark.

DESCRIPTION OF THE PREFERRED EMBODIMENTS

Figure 3:
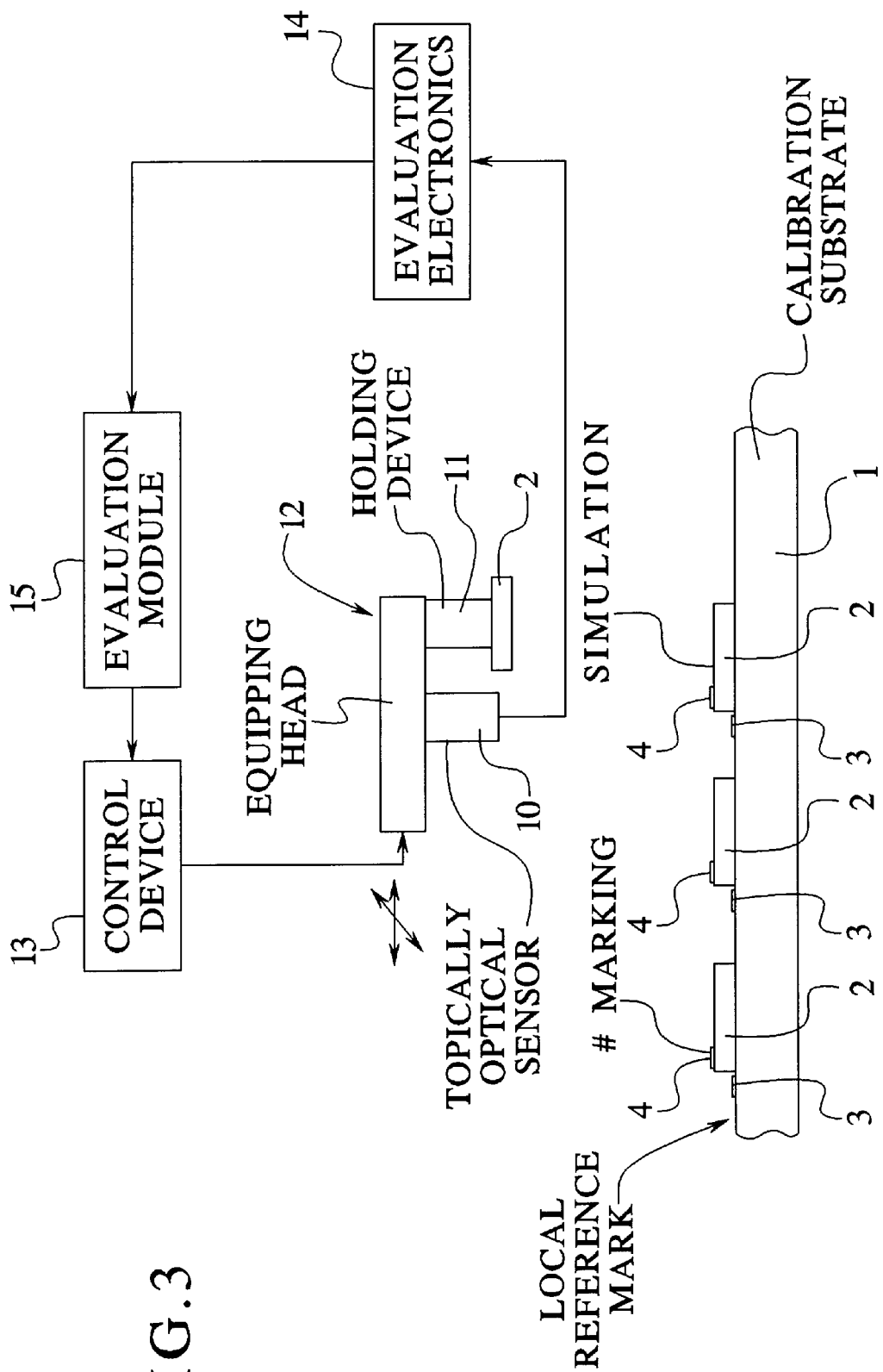
FIG. 3 depicts the calibration substrate with simulations on it and an optical sensor, which is to be calibrated with the correction marks.

FIG. 1 shows a calibration substrate 1 that was equipped with simulations 2 of components at defined locations in an automatic equipping unit for such electrical components. To that end, the simulations 2 are taken from magazines (not shown) and are transported to the calibrated substrate 1 as shown in FIG. 3 a holding device 11 on an equipping head 12 and are placed at positions provided therefor, analogous to the transport of components from delivery devices up to the placement position on the printed circuit board. The simulations 2 are composed of small glass laminae that respectively comprise markings 4 in the fashion of reticules at two corners lying diagonally opposite one another. The calibration substrate 1 is provided with local reference marks 3 at these locations spaced close to the markings 4, these reference marks 3 being applied with high positional precision.

The markings 4 and the reference marks 3 are in such close proximity that they fit into a field of view 7 (FIG. 2) topically resolving optical sensor 10 that is secured to the equipping head 12 for the components (See FIG. 3). This equipping head 12 is moveable such that the sensor can be positioned over all marked corner regions.

The topically resolving sensor 10 is connected to an evaluation electronics 14 (FIG. 3) that is in the position to determine the relative position of the markings 4 to the respective reference mark 3 without the sensor having to be thereby moved. A control device 13 (FIG. 3) of the equipping head has an evaluation module 25 that processes the individual deviations of the markings 4 from the reference marks 3 to form correction parameters for the machine. These correction parameters are automatically taken by the control device 13.

For an exact calibration of the optical sensor, a first correction mark 5 and a second correction mark 6 are applied on the calibration substrate 1 at a permanently prescribed nominal spacing a. The optical sensor 10 thereby first measures the spacing of the first 5 and of the second 6 correction mark and, by comparison to the nominal spacing a, a sensor correction factor is determined therefrom that is taken into consideration in the positional determination of the simulation 2. When the optical sensor then subsequently measures the position of the local reference marks 3 relative to the markings 4 and when the same region of the field of view 7 is thereby employed as in the measuring of the first 5 and of the second 6 correction marks, then an exact determination of the relative position between marking 4 and local reference mark 3 can ensue by taking the sensor correction factor into consideration. The highest possible precision is achieved in that the location in the field of view 7 at which the first correction mark 5 was measured coincides with the location in the field of view 7 at which the local reference mark 3 is measured. The marking 4 is then also approximately located at the location in the field of view 7 at which the second correction mark 6 was present. A region of the field of view 7 of the optical sensor is thereby employed that was previously utilized in the determination of the sensor correction factor, as a result whereof the desired precision is achieved in the measuring of the automatic equipping unit.

The markings 4 are thereby arranged relative to the local reference marks 3 such that their imaginary connecting line resides perpendicular to edges of the simulations. As a result thereof, the influence of harmful reflection on the measurement of the relative position of the markings relative to one another is minimized.

FIG. 3 depicts a substrate having a local reference mark, an optical structure feature, a simulation, and a correction mark. FIG. 3 also depicts the positionable optical sensor.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A method for calibrating a travel path and/or an angular position of a holding device in an apparatus for equipping printing circuit boards with components, comprising the steps of:

equipping a calibration substrate in a manner of a printed circuit board with simulations of the components that define placement locations;

obtaining via an optical sensor an optically measured spacing between first and second correction marks that are applied on the calibration substrate at a predetermined nominal spacing which is different then said optically measured spacing;

determining a sensor correction factor by comparing the optically measured spacing to the nominal spacing, said sensor correction factor to be taken into consideration in a subsequent positional determination of the simulations for compensation of an optical distortion of the optical sensor; and determining said subsequent positioned determination by determining a position of the simulations relative to local reference marks of the calibration substrate based on positionally defined optical structure features on the simulations by said optical sensor.

2. The method for calibrating according to claim 1 wherein a spacing of the respective local reference marks from the respective optical structure features is selected approximately equal to the nominal spacing; and wherein a position of the optical structure features relative to the local reference marks corresponds to the nominal spacing of the second correction mark from the first correction mark.

3. The method according to claim 2 wherein a shape of the local reference marks and the optical structure features corresponds to a shape of the first and second correction marks.

4. The method according to claim 1 wherein said nominal spacing is selected smaller then a field of view of the optical sensor; and wherein the first and second correction marks are simultaneously registered by the optical sensor.

5. An apparatus for equipping printed circuit boards with components, comprising:

a calibration substrate equipped in a manner of a printed circuit board with simulations of the components at defined placement locations, said calibration substrate having local reference marks thereon and also first and second correction marks, the first and second correction marks being spaced apart at a predetermined nominal spacing, and said simulations having optical structure features thereon as markings;

an equipping head having a holding device thereon for transporting components and also the simulations;

an optical sensor also on the equipping head for use in calibrating a travel path and/or an angular position of said holding device;

with said optical sensor and an evaluation electronics connected to said optical sensor, obtaining an optically measured spacing between said first and second correction marks, said predetermined nominal spacing being different then said optically measured spacing;

by use of said evaluation electronics and evaluation module connected to said evaluation electronics, determining a sensor correction factor by comparing the optically measured spacing to the nominal spacing, said sensor correction factor to be taken into consideration in a subsequent positional determination of the simulations for compensation of an optical distortion of the optical sensor; and providing a control device for receiving said sensor correction factor from said evaluation module and for controlling movement of said equipping head with the holding device thereon, said control device together with said output from said evaluation module determining said subsequent positional determination by determining a position of the simulations relative to the local reference marks of the calibration substrate based on said optical structure features on the simulations by use of said sensor.

6. The apparatus according to claim 5 wherein the correction marks, the local reference marks, and the optical structure features are crosses.

7. The apparatus according to claim 5 wherein an imaginary connecting line between the local reference marks and the optical structures features proceeds at least approximately perpendicular to edges of the simulation.

8. A calibration substrate for use in calibrating a travel path and/or an angular position of a holding device on an equipping head of an apparatus for equipping printed circuit boards with components, comprising:

a substrate having a plurality of simulations of electrical components positioned thereon, each simulation having a respective optical structure feature as a marking thereon;

a respective local reference mark for each simulation with the simulations being positioned using the respective optical structure features thereon for positioning the simulations relative to the respective local reference marks; and first and second correction marks on the substrate which are spaced from one another at a predetermined nominal spacing where said predetermined nominal spacing is at least approximately equal to a spacing between the respective local reference marks and the respective optical structure feature marking on the respective simulations.

* * * * *